United States Patent
Sherrer et al.

(10) Patent No.: US 8,814,601 B1
(45) Date of Patent: Aug. 26, 2014

(54) BATCH FABRICATED MICROCONNECTORS

(75) Inventors: David W. Sherrer, Radford, VA (US); Jean-Marc Rollin, Blacksburg, VA (US)

(73) Assignee: Nuvotronics, LLC, Radford, VA (US)

( * ) Notice: Subject to any disclaimer, the term of this patent is extended or adjusted under 35 U.S.C. 154(b) by 72 days.

(21) Appl. No.: 13/490,089

(22) Filed: Jun. 6, 2012

Related U.S. Application Data

(60) Provisional application No. 61/493,517, filed on Jun. 6, 2011.

(51) Int. Cl.
*H01R 13/40* (2006.01)
*H01R 4/34* (2006.01)

(52) U.S. Cl.
CPC ........................................ *H01R 4/34* (2013.01)
USPC ............................................ 439/625; 29/852

(58) Field of Classification Search
CPC ........... H01R 4/34; H01R 4/4809; H01R 4/64
USPC ............. 439/625; 29/852, 830, 840; 174/260, 174/262, 264
See application file for complete search history.

(56) References Cited

U.S. PATENT DOCUMENTS

| | | | |
|---|---|---|---|
| 2,812,501 A | 11/1957 | Sommers | |
| 2,914,766 A | 11/1959 | Butler | |
| 2,997,519 A | 8/1961 | Hines et al. | |
| 3,309,632 A | 3/1967 | Trudeau | |
| 3,311,966 A * | 4/1967 | Jones et al. | 29/847 |
| 3,335,489 A * | 8/1967 | Grant | 29/852 |
| 3,352,730 A * | 11/1967 | Murch, Jr. | 216/20 |
| 3,464,855 A * | 9/1969 | Quintana et al. | 427/96.9 |
| 3,560,896 A | 2/1971 | Essinger | |
| 3,760,306 A | 9/1973 | Spinner et al. | |
| 3,775,844 A | 12/1973 | Parks | |
| 3,789,129 A | 1/1974 | Ditscheid | |
| 3,791,858 A * | 2/1974 | McPherson et al. | 430/314 |
| 3,963,999 A * | 6/1976 | Nakajima et al. | 333/237 |
| 4,021,789 A * | 5/1977 | Furman et al. | 365/182 |
| 4,075,757 A * | 2/1978 | Malm et al. | 216/18 |
| 4,275,944 A * | 6/1981 | Sochor | 439/267 |
| 4,348,253 A * | 9/1982 | Subbarao et al. | 438/667 |
| 4,365,222 A | 12/1982 | Lampert et al. | |
| 4,414,424 A | 11/1983 | Mizoguchi et al. | |

(Continued)

FOREIGN PATENT DOCUMENTS

| | | |
|---|---|---|
| CA | 2055116 | 5/1992 |
| DE | 3623093 | 1/1988 |

(Continued)

OTHER PUBLICATIONS

Sherrer, D, Vanhille, K, Rollin, J.M., "PolyStrata Technology: A Disruptive Approach for 3D Microwave Components and Modules," Presentation (Apr. 23, 2010).

(Continued)

*Primary Examiner* — Amy Cohen Johnson
*Assistant Examiner* — Vladimir Imas
(74) *Attorney, Agent, or Firm* — Niels Haun; Dann Dorfman Herrell & Skillman, PC

(57) ABSTRACT

Connectors and interconnects for high power connectors which may operate at frequencies up to approximately 110 GHz and fabrication methods thereof are provided.

55 Claims, 9 Drawing Sheets

(56) References Cited

U.S. PATENT DOCUMENTS

| | | | |
|---|---|---|---|
| 4,417,393 A * | 11/1983 | Becker ............................ 29/846 |
| 4,437,074 A | 3/1984 | Cohen et al. |
| 4,521,755 A | 6/1985 | Carlson et al. |
| 4,581,301 A | 4/1986 | Michaelson |
| 4,591,411 A * | 5/1986 | Reimann ........................ 216/18 |
| 4,641,140 A | 2/1987 | Heckaman |
| 4,663,497 A * | 5/1987 | Reimann ........................ 174/264 |
| 4,673,904 A | 6/1987 | Landis |
| 4,700,159 A | 10/1987 | Jones, III |
| 4,771,294 A | 9/1988 | Wasilousky |
| 4,808,273 A * | 2/1989 | Hua et al. ...................... 205/123 |
| 4,853,656 A | 8/1989 | Guillou |
| 4,856,184 A * | 8/1989 | Doeling ......................... 29/852 |
| 4,857,418 A | 8/1989 | Schuetz |
| 4,876,322 A | 10/1989 | Budde et al. |
| 4,880,684 A * | 11/1989 | Boss et al. .................... 428/209 |
| 4,969,979 A | 11/1990 | Appelt et al. |
| 4,975,142 A * | 12/1990 | Iannacone et al. ............. 216/18 |
| 5,069,749 A * | 12/1991 | Gutierrez ...................... 438/641 |
| 5,072,201 A | 12/1991 | Devaux et al. |
| 5,100,501 A * | 3/1992 | Blumenthal et al. ........... 216/18 |
| 5,119,049 A | 6/1992 | Heller et al. |
| 5,227,013 A * | 7/1993 | Kumar ........................... 216/18 |
| 5,334,956 A | 8/1994 | Leding et al. |
| 5,381,157 A | 1/1995 | Shiga |
| 5,406,235 A | 4/1995 | Hayashi et al. |
| 5,406,423 A | 4/1995 | Sato |
| 5,430,257 A | 7/1995 | Lau et al. |
| 5,454,161 A | 10/1995 | Beilin et al. |
| 5,622,895 A * | 4/1997 | Frank et al. .................... 216/18 |
| 5,633,615 A | 5/1997 | Quan |
| 5,682,062 A * | 10/1997 | Gaul ............................... 257/686 |
| 5,682,124 A | 10/1997 | Suski |
| 5,712,607 A | 1/1998 | Dittmer et al. |
| 5,724,012 A | 3/1998 | Teunisse |
| 5,746,868 A * | 5/1998 | Abe ................................. 156/247 |
| 5,793,272 A | 8/1998 | Burghartz et al. |
| 5,814,889 A * | 9/1998 | Gaul ............................... 257/773 |
| 5,860,812 A | 1/1999 | Gugliotti |
| 5,872,399 A | 2/1999 | Lee |
| 5,925,206 A * | 7/1999 | Boyko et al. .................... 156/150 |
| 5,961,347 A | 10/1999 | Hsu |
| 5,977,842 A | 11/1999 | Brown |
| 5,990,768 A | 11/1999 | Takahashi et al. |
| 6,008,102 A | 12/1999 | Alford et al. |
| 6,027,630 A * | 2/2000 | Cohen ............................ 205/135 |
| 6,054,252 A | 4/2000 | Lundy et al. |
| 6,180,261 B1 | 1/2001 | Inoue et al. |
| 6,210,221 B1 | 4/2001 | Maury |
| 6,228,466 B1 | 5/2001 | Tsukada |
| 6,294,965 B1 | 9/2001 | Merrill et al. |
| 6,350,633 B1 * | 2/2002 | Lin ................................. 438/113 |
| 6,388,198 B1 * | 5/2002 | Bertin et al. .................... 174/251 |
| 6,457,979 B1 | 10/2002 | Dove et al. |
| 6,465,747 B2 | 10/2002 | DiStefano |
| 6,466,112 B1 | 10/2002 | Kwon et al. |
| 6,514,845 B1 | 2/2003 | Eng |
| 6,518,165 B1 | 2/2003 | Yoon et al. |
| 6,535,088 B1 | 3/2003 | Sherman et al. |
| 6,589,594 B1 * | 7/2003 | Hembree ....................... 438/106 |
| 6,600,395 B1 | 7/2003 | Handforth et al. |
| 6,603,376 B1 | 8/2003 | Handforth et al. |
| 6,648,653 B2 | 11/2003 | Huang et al. |
| 6,662,443 B2 * | 12/2003 | Chou et al. ...................... 29/852 |
| 6,677,248 B2 | 1/2004 | Kwon |
| 6,749,737 B2 | 6/2004 | Cheng |
| 6,800,360 B2 | 10/2004 | Miyanaga |
| 6,800,555 B2 | 10/2004 | Test |
| 6,827,608 B2 | 12/2004 | Hall et al. |
| 6,850,084 B2 * | 2/2005 | Hembree ................. 324/754.04 |
| 6,888,427 B2 | 5/2005 | Sinsheimer et al. |
| 6,943,452 B2 * | 9/2005 | Bertin et al. ................... 257/774 |
| 6,971,913 B1 | 12/2005 | Chu |
| 6,981,414 B2 | 1/2006 | Knowles et al. |
| 7,005,750 B2 | 2/2006 | Liu |
| 7,012,489 B2 | 3/2006 | Sherrer et al. |
| 7,064,449 B2 | 6/2006 | Lin |
| 7,077,697 B2 | 7/2006 | Kooiman |
| D530,674 S | 10/2006 | Ko |
| 7,129,163 B2 | 10/2006 | Sherrer |
| 7,148,141 B2 | 12/2006 | Shim et al. |
| 7,148,772 B2 | 12/2006 | Sherrer et al. |
| 7,165,974 B2 | 1/2007 | Kooiman |
| 7,217,156 B2 | 5/2007 | Wang |
| 7,222,420 B2 * | 5/2007 | Moriizumi ..................... 29/830 |
| 7,239,219 B2 | 7/2007 | Brown et al. |
| 7,252,861 B2 | 8/2007 | Smalley |
| 7,259,640 B2 | 8/2007 | Brown et al. |
| 7,400,222 B2 | 7/2008 | Kwon et al. |
| 7,405,638 B2 | 7/2008 | Sherrer et al. |
| 7,449,784 B2 | 11/2008 | Sherrer et al. |
| 7,478,475 B2 | 1/2009 | Hall |
| 7,508,065 B2 | 3/2009 | Sherrer et al. |
| 7,575,474 B1 | 8/2009 | Dodson et al. |
| 7,579,553 B2 * | 8/2009 | Moriizumi ..................... 174/260 |
| 7,602,059 B2 * | 10/2009 | Nobutaka et al. ............. 257/697 |
| 7,649,432 B2 | 1/2010 | Sherrer et al. |
| 7,656,256 B2 | 2/2010 | Houck et al. |
| 7,658,831 B2 | 2/2010 | Mathieu et al. |
| 7,705,456 B2 * | 4/2010 | Hu ................................... 257/737 |
| 7,755,174 B2 | 7/2010 | Rollin et al. |
| 7,898,356 B2 | 3/2011 | Sherrer et al. |
| 7,948,335 B2 | 5/2011 | Sherrer et al. |
| 8,011,959 B1 | 9/2011 | Tsai et al. |
| 8,031,037 B2 | 10/2011 | Sherrer et al. |
| 8,304,666 B2 * | 11/2012 | Ko et al. ......................... 174/262 |
| 8,339,232 B2 | 12/2012 | Lotfi |
| 8,441,118 B2 * | 5/2013 | Hua ................................. 257/698 |
| 8,522,430 B2 * | 9/2013 | Kacker et al. .................. 29/852 |
| 8,542,079 B2 * | 9/2013 | Sherrer et al. .................. 333/34 |
| 2002/0075104 A1 | 6/2002 | Kwon et al. |
| 2003/0029729 A1 | 2/2003 | Cheng et al. |
| 2003/0052755 A1 | 3/2003 | Barnes et al. |
| 2003/0117237 A1 | 6/2003 | Niu |
| 2003/0221968 A1 * | 12/2003 | Cohen et al. ................... 205/118 |
| 2003/0222738 A1 | 12/2003 | Brown et al. |
| 2004/0004061 A1 | 1/2004 | Merdan |
| 2004/0007468 A1 * | 1/2004 | Cohen et al. ................... 205/118 |
| 2004/0007470 A1 | 1/2004 | Smalley |
| 2004/0038586 A1 | 2/2004 | Hall et al. |
| 2004/0076806 A1 | 4/2004 | Miyanaga et al. |
| 2004/0196112 A1 | 10/2004 | Welbon |
| 2004/0263290 A1 | 12/2004 | Sherrer et al. |
| 2005/0030124 A1 | 2/2005 | Okamoto et al. |
| 2005/0045484 A1 | 3/2005 | Smalley et al. |
| 2005/0156693 A1 | 7/2005 | Dove et al. |
| 2005/0230145 A1 | 10/2005 | Ishii et al. |
| 2005/0250253 A1 | 11/2005 | Cheung |
| 2008/0191817 A1 | 8/2008 | Sherrer |
| 2008/0240656 A1 | 10/2008 | Rollin et al. |
| 2009/0154972 A1 | 6/2009 | Tanaka et al. |
| 2010/0015850 A1 | 1/2010 | Stein |
| 2010/0109819 A1 | 5/2010 | Houck et al. |
| 2010/0296252 A1 | 11/2010 | Rollin et al. |
| 2011/0123783 A1 | 5/2011 | Sherrer |
| 2011/0181376 A1 | 7/2011 | Vanhille et al. |
| 2011/0181377 A1 | 7/2011 | Vanhille et al. |
| 2011/0210807 A1 | 9/2011 | Sherrer et al. |
| 2011/0273241 A1 | 11/2011 | Sherrer et al. |
| 2013/0050055 A1 | 2/2013 | Paradiso et al. |
| 2013/0127577 A1 | 5/2013 | Lotfi |

FOREIGN PATENT DOCUMENTS

| | | |
|---|---|---|
| EP | 398019 | 11/1990 |
| EP | 485831 | 5/1992 |
| EP | 845831 | 6/1998 |
| EP | 911903 | 4/1999 |
| FR | 2086327 | 12/1971 |
| JP | 3027587 | 2/1991 |
| JP | 6085510 | 3/1994 |
| JP | 6302964 | 10/1994 |
| JP | H10041710 | 2/1998 |
| TW | I244799BB | 12/2005 |

(56) References Cited

FOREIGN PATENT DOCUMENTS

| WO | 0007218 | 2/2000 |
|---|---|---|
| WO | 0039854 | 7/2000 |
| WO | 0206152 | 1/2002 |
| WO | 02080279 | 10/2002 |
| WO | 2004004061 | 1/2004 |

OTHER PUBLICATIONS

All Darwish et al.; Vertical Balun and Wilkinson Divider; 2002 IEEE MTT-S Digest; pp. 109-112.
Brown et al., "A Low-Loss Ka-Band Filter in Rectangular Coax Made by Electrochemical Fabrication", submitted to Microwave and Wireless Components Letters, date unknown (downloaded from www.memgen.com, 2004).
Chwomnawang et al., "On-chip 3D Air Core Micro-Inductor for High-Frequency Applications Using Deformation of Sacrificial Polymer", Proc. SPIE, vol. 4334, pp. 54-62, Mar. 2001.
Cole, B.E., et al., Micromachined Pixel Arrays Integrated with CMOS for Infrared Applications, pp. 64-64 (2000).
De Los Santos, H.J., Introduction to Microelectromechanical (MEM) Microwave Systems (pp. 4, 7-8, 13) (1999).
Deyong, C., et al., A Microstructure Semiconductor Thermocouple for Microwave Power Sensors, 1997 Asia Pacific Microwave Conference, pp. 917-919.
Elliott Brown/MEMGen Corporation, "RF Applications of EFAB Technology", MTT-S IMS 2003, pp. 1-15.
Engelmann et al., "Fabrication of High Depth-to-Width Aspect Ratio Microstructures", IEEE Micro Electro Mechanical Systems (Feb. 1992), pp. 93-98.
Filipovic, et al., "Modeling, Design, Fabrication, and Performance of Rectangular u-Coaxial Lines and Components", Microwave Symposium Digest, 2006, IEEE; Jun. 1, 2006; pp. 1393-1396.
Franssila, S., Introduction to Microfabrication, (pp. 8) (2004).
Frazier et al., "Metallic Microstructures Fabricated Using Photosensitive Polyimide Electroplating Molds", Journal of Microelectromechanical Systems, vol. 2, No. 2, Jun. 1993, pp. 87-94.
Ghodisian, B., et al., Fabrication of Affordable Metallic Microstructures by Electroplating and Photoresist Molds, 1996, pp. 68-71.
H. Guckel, "High-Aspect-Ratio Micromachining Via Deep X-Ray Lithography", Proc. of IEEE, vol. 86, No. 8 (Aug. 1998), pp. 1586-1593.
Hawkins, C.F., The Microelectronics Failure Analysis, Desk Reference Edition (2004).
Jeong, Inho et al., "High-Performance Air-Gap Transmission Lines and Inductors for Millimeter-Wave Applications", IEEE Transactions on Microwave Theory and Techniques, Dec. 2002, pp. 2850-2855, vol. 50, No. 12.
Katehi et al., "MEMS and Si Micromachined Circuits for High-Frequency Applications", IEEE Transactions on Microwave Theory and Techniques, vol. 50, No. 3, Mar. 2002, pp. 858-866.
Kwok, P.Y., et al., Fluid Effects in Vibrating Micromachined Structures, Journal of Microelectromechanical Systems, vol. 14, No. 4, Aug. 2005, pp. 770-781.
Lee et al., "Micromachining Applications of a High Resolution Ultrathick Photoresist", J. Vac. Sci. Technol. B 13 (6), Nov./Dec. 1995, pp. 3012-3016.
Loechel et al., "Application of Ultraviolet Depth Lithography for Surface Micromachining", J. Vac. Sci. Technol. B 13 (6), Nov./Dec. 1995, pp. 2934-2939.
Madou, M.J., Fundamentals of Microfabrication: The Science of Miniaturization, 2d Ed., 2002 (Roadmap; pp. 615-668).
Park et al., "Electroplated Micro-Inductors and Micro-Transformers for Wireless application", IMAPS 2002, Denver, CO, Sep. 2002.
Sedky, S., Post-Processing Techniques for Integrated MEMS (pp. 9, 11, 164) (2006).
Tummala et al.; "Microelectronics Packaging Handbook"; Jan. 1, 1989; XP002477031; pp. 710-714.

Yeh, J.L., et al., Copper-Encapsulated Silicon Micromachined Structures, Journal of Microelectromechanical Systems, vol. 9, No. 3, Sep. 2000, pp. 281-287.
Yoon et al., "3-D Lithography and Metal Surface Micromachining for RF and Microwave MEMs" IEEE MEMS 2002 Conference, Las Vegas, NV, Jan. 2002, pp. 673-676.
Yoon et al., "CMOS-Compatible Surface Micromachined Suspended-Spiral Inductors for Multi-GHz Sillicon RF Ics", IEEE Electron Device Letters, vol. 23, No. 10, Oct. 2002, pp. 591-593.
Yoon et al., "High-Performance Electroplated Solenoid-Type Integrated Inductor (Sl2) for RF Applications Using Simple 3D Surface Micromachining Technology", Int'l Election Devices Meeting, 1998, San Francisco, CA, Dec. 6-9, 1998, pp. 544-547.
Yoon et al., "High-Performance Three-Dimensional On-Chip Inductors Fabricated by Novel Micromahining Technology for RF MMIC", 1999 IEEE MTT-S Int'l Microwave Symposium Digest., vol. 4, Jun. 13-19, 1999, Anaheim, California, pp. 1523-1526.
Yoon et al., "Monolithic High-Q Overhang Inductors Fabricated on Silicon and Glass Substrates", International Electron Devices Meeting, Washington D.C. (Dec. 1999), pp. 753-756.
Yoon et al., "Monolithic Integration of 3-D Electroplated Microstructures with Unlimited Number of Levels Using Planarization with a Sacrificial Metallic Mole (PSMm)", Twelfth IEEE Int'l Conf. on Micro Electro mechanical systems, Orlando Florida, Jan. 1999, pp. 624-629.
Yoon et al., "Multilevel Microstructure Fabrication Using Single-Step 3D Photolithography and Single-Step Electroplating", Proc. of SPIE, vol. 3512, (Sep. 1998), pp. 358-366.
Saito, Y., Fontaine, D., Rollin, J-M., Filipovic, D., "Micro-Coaxial Ka-Band Gysel Power Dividers," Microwave Opt Technol Lett 52: 474-478, 2010.
Kenneth J. Vanhille et al.; Micro-Coaxial Imedance Transformers; Journal of Latex Class Files; vol. 6; No. 1; Jan. 2007.
European Examination Report dated Mar. 21, 2013 for EP Application No. 07150463.3.
Chance, G.I. et al., "A suspended-membrane balanced frequency doubler at 200GHz," 29th International Conference on Infrared and Millimeter Waves and Terahertz Electronics, pp. 321-322, Karlsrube, 2004.
Immorlica, Jr., T. et al., "Miniature 3D micro-machined solid state power amplifiers," COMCAS 2008.
Ehsan, N. et al., "Microcoaxial lines for active hybrid-monolithic circuits," 2009 IEEE MTT-S Int. Microwave.Symp. Boston, MA, Jun. 2009.
Filipovic, D. et al., "Monolithic rectangular coaxial lines. Components and systems for commercial and defense applications," Presented at 2008 IASTED Antennas, Radar, and Wave Propagation Conferences, Baltimore, MD, USA, Apr. 2008.
Filipovic, D.S., "Design of microfabricated rectangular coaxial lines and components for mm-wave applications," Microwave Review, vol. 12, No. 2, Nov. 2006, pp. 11-16.
Ingram, D.L. et al., "A 427 mW 20% compact W-band InP HEMT MMIC power amplifier," IEEE RFIC Symp. Digest 1999, pp. 95-98.
Lukic, M. et al., "Surface-micromachined dual Ka-band cavity backed patch antennas," IEEE Trans. AtennasPropag., vol. 55, pp. 2107-2110, Jul. 2007.
Oliver, J.M. et al., "A 3-D micromachined W-band cavity backed patch antenna array with integrated rectacoax transition to wave guide," 2009 Proc. IEEE International Microwave Symposium, Boston, MA 2009.
Rollin, J.M. et al., "A membrane planar diode for 200GHz mixing applications," 29th International Conference on Infrared and Millimeter Waves and Terahertz Electronics, pp. 205-206, Karlsrube, 2004.
Rollin, J.M. et al., "Integrated Schottky diode for a sub-harmonic mixer at millimetre wavelengths," 31st International Conference on Infrared and Millimeter Waves and Terahertz Electronics, Paris, 2006.
Saito et al., "Analysis and design of monolithic rectangular coaxial lines for minimum coupling," IEEE Trans. Microwave Theory Tech., vol. 55, pp. 2521-2530, Dec. 2007.
Vanhille, K. et al., "Balanced low-loss Ka-band p-coaxial hybrids," IEEE MTT-S Dig., Honolulu, Hawaii, Jun. 2007.

(56) References Cited

OTHER PUBLICATIONS

Vanhille, K. et al., "Ka-Band surface mount directional coupler fabricated using micro-rectangular coaxial transmission lines," 2008 Proc. IEEE International Microwave Symposium, 2008.

Vanhille, K.J. et al., "Ka-band miniaturized quasi-planar high-Q resonators," IEEE Trans. Microwave Theory Tech., vol. 55, No. 6, pp. 1272-1279, Jun. 2007.

Vyas R. et al., "Liquid Crystal Polymer (LCP): The ultimate solution for low-cost RF flexible electronics and antennas," Antennas and Propagation Society, International Symposium, p. 1729-1732 (2007).

Wang, H. et al., "Design of a low integrated sub-harmonic mixer at 183GHz using European Schottky diode technology," From Proceedings of the 4th ESA workshop on Millimetre-Wave Technology and Applications, pp. 249-252, Espoo, Finland, Feb. 2006.

Wang, H. et al., "Power-amplifier modules covering 70-113 GHz using MMICs," IEEE Trans Microwave Theory and Tech., vol. 39, pp. 9-16, Jan. 2001.

Vanhille, K., "Design and Characterization of Microfabricated Three-Dimensional Millimeter-Wave Components," Dissertation, 2007.

Ehsan, N., "Broadband Microwave Litographic 3D Components," Dissertation 2009.

Colantonio, P., et al., "High Efficiency RF and Microwave Solid State Power Amplifiers," pp. 380-395, 2009.

European Examination Report of corresponding European Patent Application No. 08 15 3144 dated Apr. 6, 2010.

European Examination Report of corresponding European Patent Application No. 08 15 3144 dated Feb. 22, 2012.

European Examination Report of corresponding European Patent Application No. 08 15 3144 dated Nov. 10, 2008.

European Search Report for corresponding EP Application No. 07150463.3 dated Apr. 23, 2012.

European Search Report of Corresponding European Application No. 07 15 0467 mailed Apr. 28, 2008.

European Search Report of corresponding European Application No. 08 15 3138 mailed Jul. 4, 2008.

European Search Report of corresponding European Application No. 08153138.6 mailed Jul. 15, 2008.

European Search Report of corresponding European Patent Application No. 08 15 3144 dated Jul. 2, 2008.

International Preliminary Report on Patentability dated Jul. 24, 2012 for corresponding PCT/US2011/022173.

International Preliminary Report on Patentability dated May 19, 2006 on corresponding PCT/US04/06665.

International Search Report dated Aug. 29, 2005 on corresponding PCT/US04/06665.

Jeong, I., et al., "High Performance Air-Gap Transmission Lines and Inductors for Milimeter-Wave Applications", Transactions on Microwave Theory and Techniques, vol. 50, No. 12, Dec. 2002.

PwrSoC Update 2012: Technology, Challenges, and Opportunities for Power Supply on Chip, Presentation (Mar. 18, 2013).

Written Opinion of the International Searching Authority dated Aug. 29, 2005 on corresponding PCT/US04/06665.

Yoon et al., "High-Performance Electroplated Solenoid-Type Integrated Inductor (S12) for RF Applications Using Simple 3D Surface Micromachining Technology", Int'l Election Devices Meeting, 1998, San Francisco, CA, Dec. 6-9, 1998, pp. 544-547.

\* cited by examiner

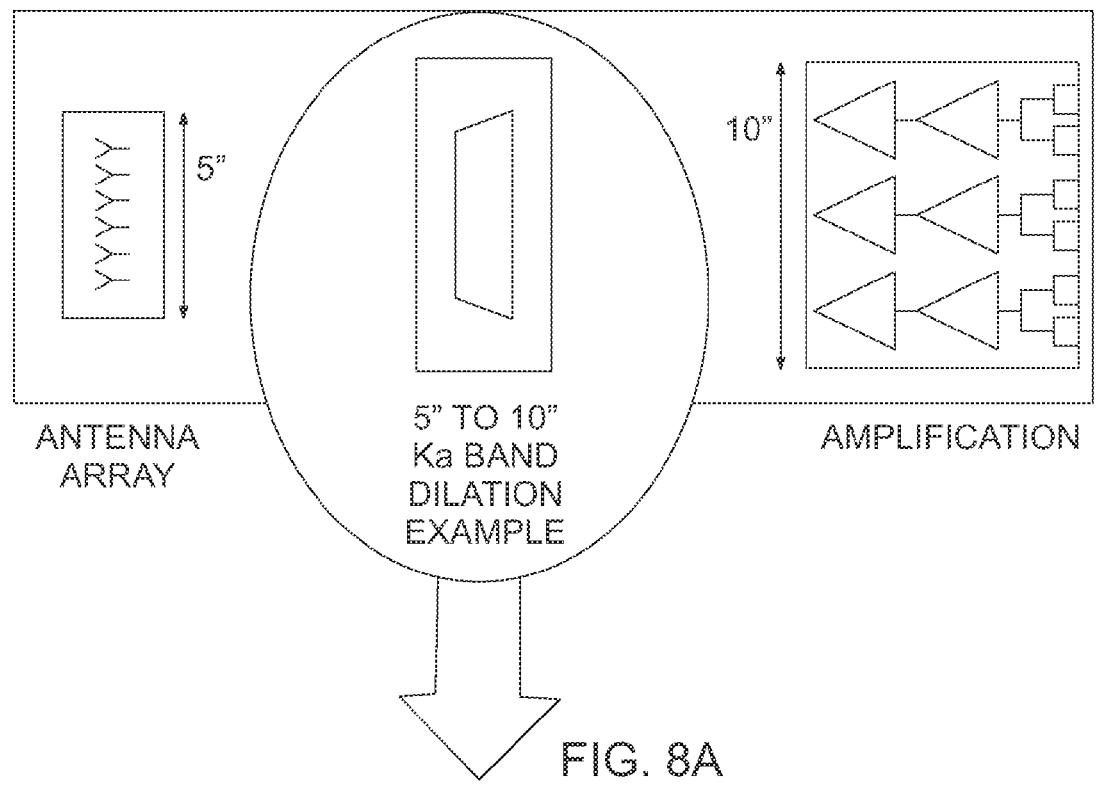
FIG. 8A
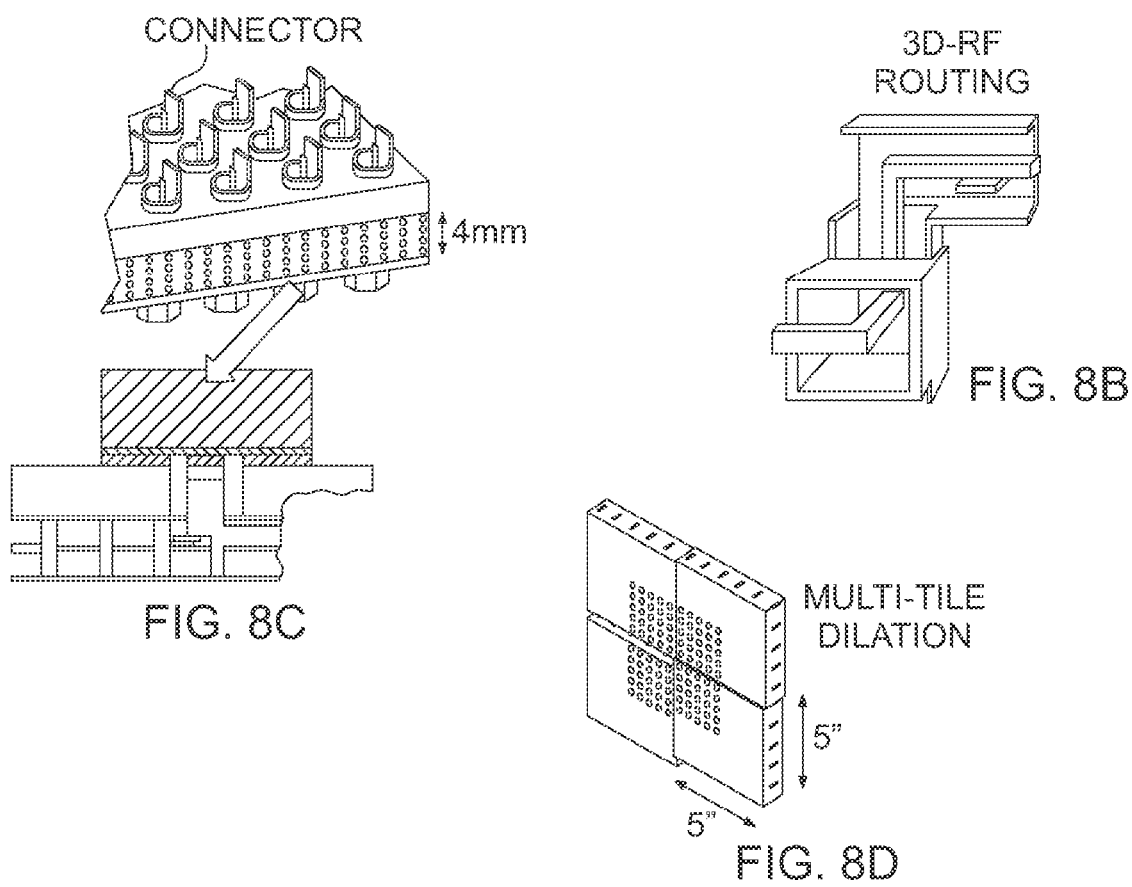
FIG. 8B
FIG. 8C
FIG. 8D

BATCH FABRICATED MICROCONNECTORS

RELATED APPLICATIONS

This application claims the benefit of priority of U.S. Provisional Application No. 61/493,517, filed on Jun. 6, 2011, the entire contents of which application are incorporated herein by reference.

FIELD OF THE INVENTION

The present invention relates generally to connectors and/or interconnects, and more particularly, but not exclusively, to high power connectors which may operate at frequencies up to approximately 100 to 300 GHz or higher, as well as batch fabrication methods thereof to optionally provide an array of such connectors.

BACKGROUND OF THE INVENTION

Current millimeter wave capable connectors are typically very expensive due to the precision required in their construction. While a high price may be acceptable for low volume test and measurement application, systems that operate into such frequencies can require hundreds to many thousands of these connectors and their costs can become a problem. By way of example, creating phased arrays and/or other electronic warfare (EW) systems that can span into the upper EHF range may require practical, cost-effective interconnect solutions. High effective radiated power (ERP) EW, radar, or communications $K_a$ band phased arrays may address the problem of pitch mismatch between the power electronics and the antenna array pitch using connector and cable dilations to increase the pitch to one acceptable for the power electronics. While expensive demonstrators may be shown without breakable interconnect, both high yield manufacturing, re-use, and practical deployment over a service lifetime may be expected to require modularity provided by make/break interconnect. As such, it may be desirable to build systems from standardized modules or sub-assemblies and allow for modular construction and/or field service, such as the separation of antenna sections from dilation layers from power T or T/R (transmit or transmit/receive) modules. Increasing the modularity in a high end microwave system can be an important step in allowing such systems to reduce in cost and thereby increase the quantity used. To this end, some systems may contain hundreds to thousands of blind-mate floating connectors, for example, to accomplish just a change in pitch between antennas and electronics (dilations). Volume cost of a 100-GHz-capable subminiature push-on connector series (SMPS) connector (G3PO-like) is currently greater than $35 for a bullet and two male shrouds. Add a phased controlled cable, and there may be well over $200 per element often spent for the assembly for each coaxial channel. This can amount to more than ~$100,000 per 20×20 array in the dilation and its interconnect.

The problem may become worse at higher frequencies where connector costs may increase and/or can no longer fit on a half-wavelength element-to-element pitch. Interconnection at an element pitch at W band would require ~1.5 mm OD on the connector—about 5× smaller in linear dimension than SMPS/G3PO connectors. Making the connections permanent is an approach to address this problem. However, this precludes ease of service and/or may make production yield substantially unobtainable. Another problem in interconnect for EW, radar, or communications may be power handling. A G3PO may be rated at ~18W at 50 GHz. Voltage standing wave ratio (VSWR) and/or voltage breakdown may not account for this limit. In addition, floating connector systems may utilize Be:Cu for the core metal and polymer for the dielectric. At increasing frequency, skin effect loss mechanisms may produce heating of the center pin metals which may have poor thermal transfer. Due to misalignment loading, a Teflon® dielectric (PTFE) may be prone to creep at increasing temperatures.

Thus, a need exists to address interconnect and/or connectors themselves spanning DC to 110 GHz or greater as a development problem to be addressed in terms of cost, size, and the like. Related machining, e.g., turning, operations may be incapable of providing cost effective precision with micron level accuracy for mm-scale devices.

SUMMARY OF THE INVENTION

In one of its aspects, the present invention relates to connectors and/or interconnect, having a relatively smaller size and lower cost (e.g., 10-fold lower) than existing devices. In addition, the present invention relates to microfabrication processes, or three-dimensional precision manufacturing process, for example ones used to create suspended rectacoax lines, MMIC sockets, and/or millimeter-wave (MMW) interconnection circuits with relatively low loss, small size/high density, and/or durability. The exemplary processes may facilitate batch manufacturing approaches which may achieve desired tolerances without the need for precision machining operations to obtain such tolerances. As such, the exemplary processes may employ lithography and/or multilayer electroforming to produce a plurality (e.g., thousands) of connectors at a time. As a result of such processes, exemplary devices of the present invention may operate at 500 µm and lower device dimensions, and may achieve tolerances on the submicron scale useful, for example, in microfabrication.

For example, the present invention may provide a multilayer microconnector structure formed by a multilayer additive build process, which includes a base layer having first and second opposing surfaces and having a plurality of vias extending therebetween. A conductive material may be disposed within the vias and may be configured to provide electrical communication between the first and second surfaces. A first layer of conductor material may be disposed over the base layer at the first surface, with the conductive layer comprising a plurality of electrically isolated upper conductive connector portions. Each upper connector portion may be disposed in electrical communication with the conductive material of a respective via. A second layer of conductor material may be disposed over the base layer at the second surface, with the second conductive layer comprising a plurality of electrically isolated conductive lower connector portions. Each lower connector portion may be disposed in electrical communication with the conductive material of a respective via, so that the upper and lower conductor portions are structured to provide a microconnector.

In addition, the present invention may provide a method for forming a multilayer microconnector structure comprising depositing a plurality of layers, wherein the layers comprise one or more of a metal material, a sacrificial mold material, and a dielectric material, thereby forming a multilayer microconnector structure. The structure may include a base layer having first and second opposing surfaces and having a plurality of vias extending therebetween; a conductive material disposed within the vias and configured to provide electrical communication between the first and second surfaces; a first layer of conductor material disposed over the base layer at the first surface, the conductive layer comprising a plurality of electrically isolated upper conductive connector portions, each upper connector portion disposed in electrical communication with the conductive material of a respective via; and a second layer of conductor material disposed over the base layer at the second surface, the second conductive layer comprising a plurality of electrically isolated conductive lower connector portions, each lower connector portion disposed in electrical communication with the conductive material of a respective via, wherein the upper and lower conductor portions are structured to provide a microconnector.

BRIEF DESCRIPTION OF THE DRAWINGS

The foregoing summary and the following detailed description of the exemplary embodiments of the present invention may be further understood when read in conjunction with the appended drawings, in which:

FIG. 8A schematically illustrates a monolithically formed 1-110 GHz capable dilation made with a low-loss, PolyStrata, 3D coaxial RF routing redistribution substrate, showing dilation from a 5" array to a 10" array (1:2 dilation);

FIG. 8B schematically illustrates 3D-RF coaxial routing associated with the dilation of FIG. 8A;

FIG. 8C schematically illustrates connectors mounted on the surfaces of a dilation of type of FIG. 8A; and FIG. 8D schematically illustrates an isometric view of a multi-tile dilation showing a 5"×5" array on a front surface, the multi-tile dilation measuring 10" by 10" to realize a 5" to 10" dilation of FIG. 8A.

DETAILED DESCRIPTION OF THE INVENTION

The present invention, in one of its aspects, relates to electric, electronic and/or electromagnetic devices, and/or processes thereof. Exemplary devices in accordance with the present invention may provide DC-110 GHz interconnect components for use in phased array systems exhibiting high density, broadband performance, and/or relatively low-loss. (While DC-110 GHz is used as an example, it should be understood that other suitable frequency bands may be used, such as DC to 50, 100, 150, 250 or more GHz, for example.). The devices and methods of the present invention may provide structures that can be scaled down approximately fivefold in size over current structures. In addition, approximately 50,000 parts, for example, may be fabricated at one time over a substrate with substantially no machining required, greatly reducing manufacturing cost.

In certain of its aspects, the present invention may relate to three-dimensional microstructures and/or processes thereof, such as waveguide structures, for example, which three dimensional microstructures may provide a variety of advantages. Examples of such microstructures and methods for their fabrication are illustrated at least in U.S. Pat. Nos. 7,948, 335, 7,405,638, 7,148,772, 7,012,489, 7,649,432, 7,656,256, 7,755,174, 7,898,356 and/or U.S. Application Pub. Nos. 2010/0109819, 2011/0210807, 2010/0296252, 2011/0273241, 2011/0123783, 2011/0181376 and/or 2011/0181377, each of which is incorporated herein by reference in their entirety (hereinafter the "incorporated PolyStrata art"). As used herein, the term "PolyStrata" refers to the devices made by, or methods detailed in, any of the aforementioned and incorporated U.S. Patents and Published Applications. While the PolyStrata processes are one way to produce such structures, any other suitable methods to create similar electromechanical precision structures could be employed. For example processes such as Deep Reactive Ion Etching, micromolding, LIGA, 3D printing, and so on could be leveraged.

Figure 1:
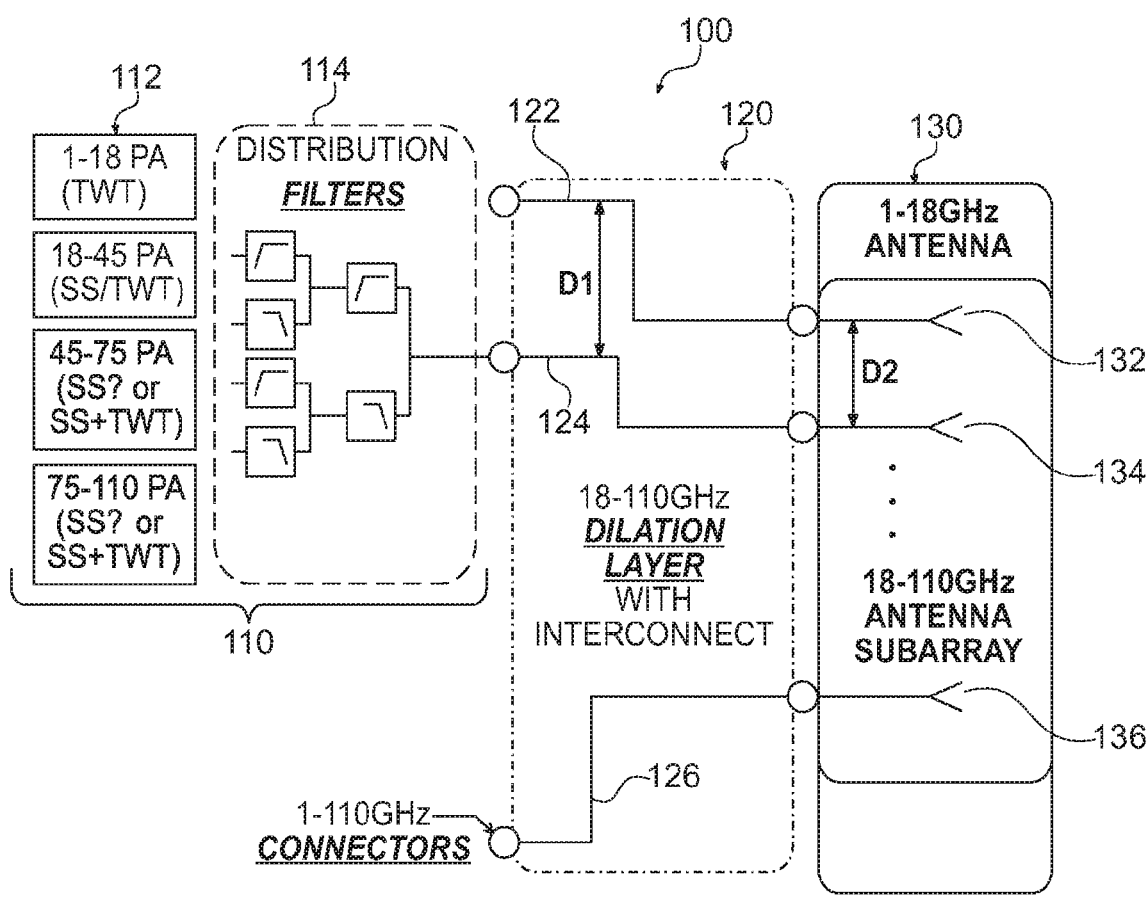
FIG. 1 schematically illustrates an overall system architecture of a 1-110 GHz electronic attack or extremely broadbanded electronically steerable array system in which a large quantity of small connectors of the present invention may be employed, which connectors may operate over the full band, to interconnect either or both sides of the dilation layer.

Referring now to the figures, wherein like elements are numbered alike throughout, FIG. 1 schematically illustrates an exemplary system architecture 100, an electronic attack system, in which devices, such as connectors, of the present invention may be utilized. The system 100 may include system electronics 110 comprising a plurality of traveling wave tube (TWT) and/or solid state (SS) amplifiers 112 along with a series of distribution filters 114. An antenna system 130, operable over 1-110 GHz, for example, may be connected with the system electronics 110 via a dilation layer 120 comprising connectors that are operable over the same frequency range. Individual antennas 132, 134, 136 may each be connected to a respective connector 122, 124, 126 of the dilation layer 120 which in turn provides connection to respective electronics of the system electronics 110. Adjacent connectors 122, 124 may be separated by a distance D2 at the point of connection to respective antennas 132, 134 to match the distance of separation between respective adjacent antennas 132, 134. Likewise, the distance between adjacent connectors 122, 124 at the point of connection to the system electronics 110 may be separated by a distance D1 which is matched to the separation distance between adjacent corresponding components of the system electronics 110. D1 may be greater than D2 such that an array of connectors 122, 124, 126 provides dilation to address the mismatch in pitch between the relatively higher pitch of the antenna system 130 and the relatively lower pitch of the system electronics 110. For example, a broad-band phased array system 100 may require redistribution from the antenna pitch to the system electronics 110, even if the antenna system 130 is broken into several apertures. At the upper limit of the band (110 GHz) the 1.4-mm, λ/2 (half-wavelength) pitch may include redistribution for the electronics 110, for example, since the front-end electronics 110 may require electronic subsystems for up to each of four separate bands.

Figure 2A:
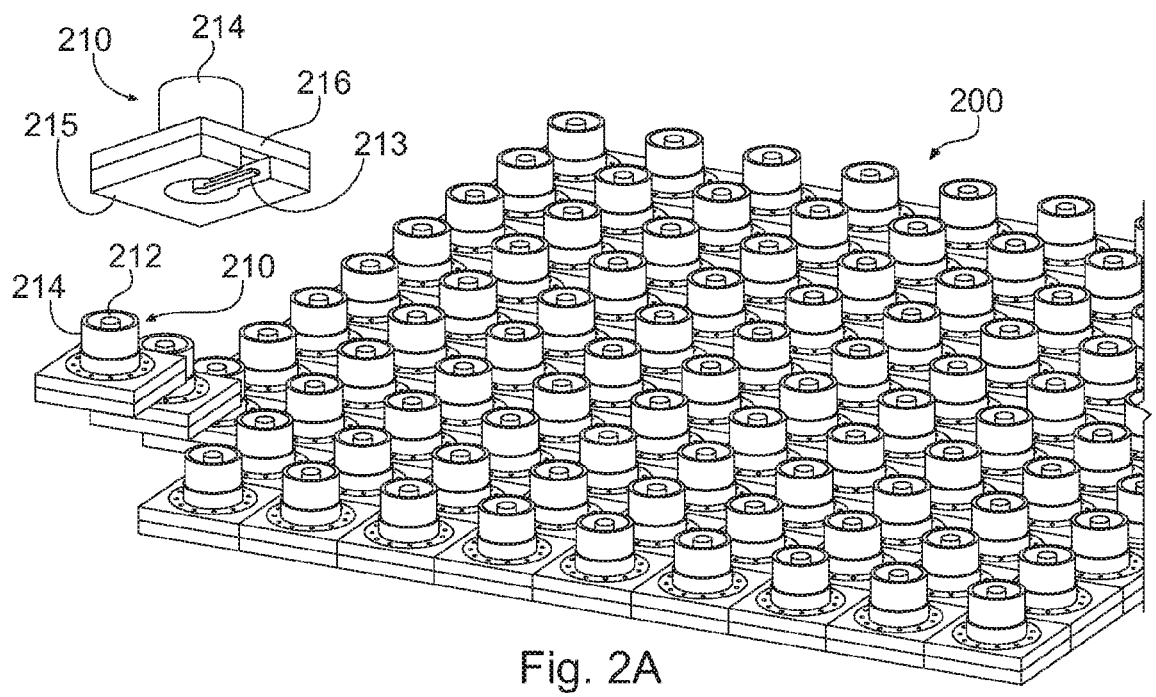
FIG. 2A schematically illustrates an exemplary configuration of a surface-mount version of a 1-110 GHz connector array in accordance with the present invention made via batch manufacturing.

In order to conveniently and reliably provide the multitudinous connections that may be required between the system electronics 110 and individual antennas 132, 134, 136, the connectors 122, 124, 126 of the present invention may be provided as a two dimensional array 200 of coaxial connectors 210, FIG. 2A, for example. As such, the connector array 200 may be provided via a batch manufacturing process, such as the PolyStrata multilayer additive build processes of the incorporated PolyStrata art, or via other suitable technology, to provide an array 200 of approximately as many as 50,000 connectors 210, for example. A variety of different possible connector configurations may be utilized in the array 200. For instance, the connector array 200 may include a plurality of coaxial male surface-mount connectors 210 which include a center conductor 212 and outer conductor 214 mounted to a substrate 216, FIGS. 2A, 5A. To facilitate surface mounting, the connector 210 may include a center conductor mounting foot 213 and outer conductor mounting foot 215 electrically connected with the center conductor 212 and outer conductor 214, respectively, FIGS. 2A, 5A. Solder 201 may be provided on a lower surface of the center conductor and outer conductor mounting feet 213, 215.

Figure 2B:
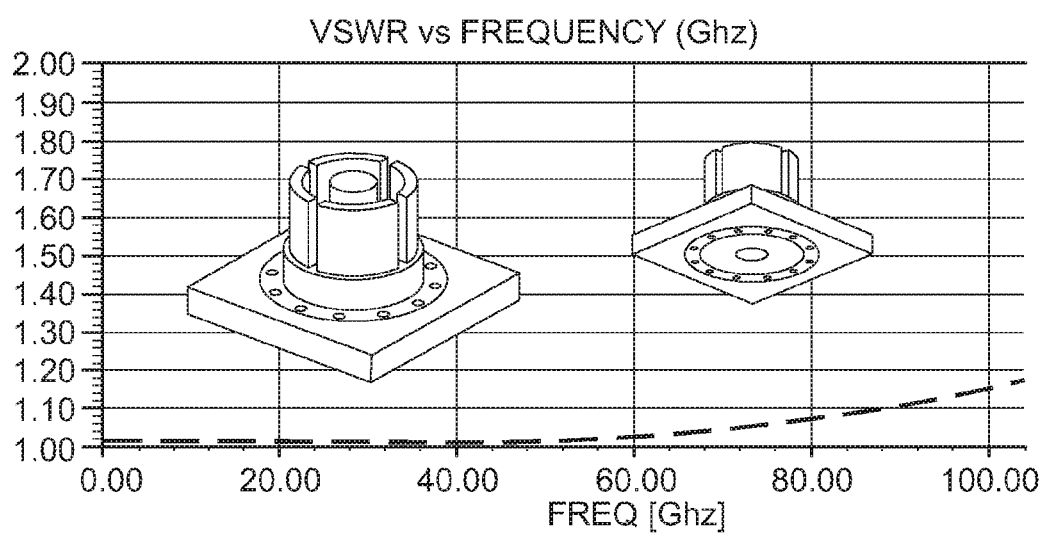
FIG. 2B illustrates a VSWR of less than approximately 1.3:1 to 110 GHz for the upper, non-SMT mounting structure of the exemplary connector of FIG. 2A.
Figure 2C:
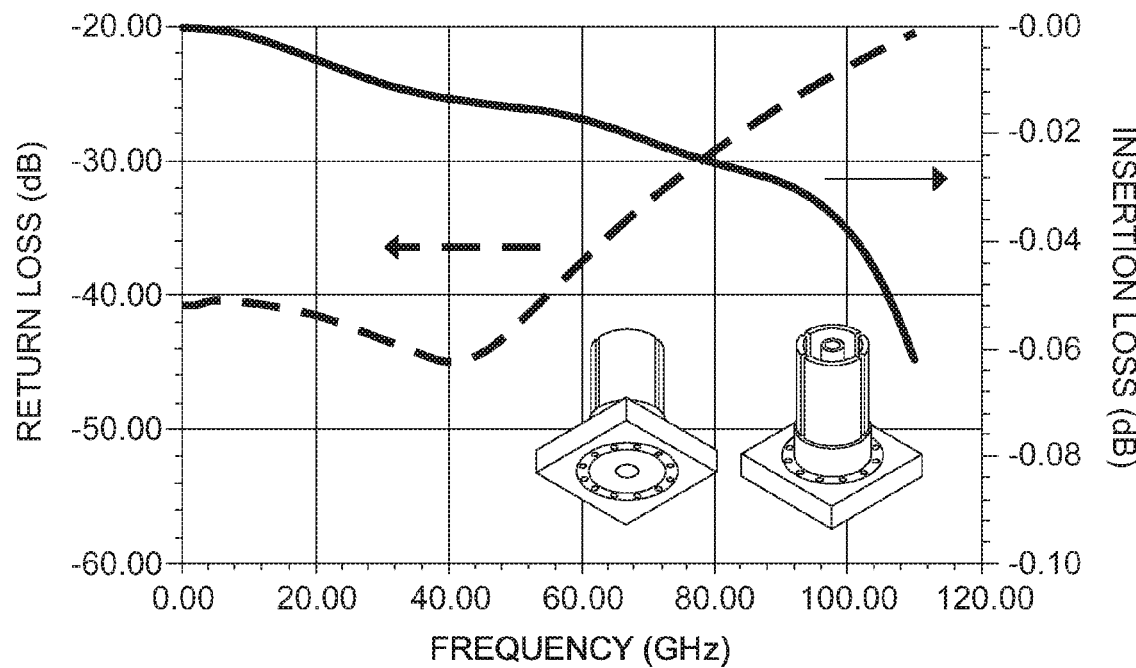
FIG. 2C illustrates the return loss and insertion loss for an exemplary surface-mount connector in accordance with the present invention.
Figure 5A:
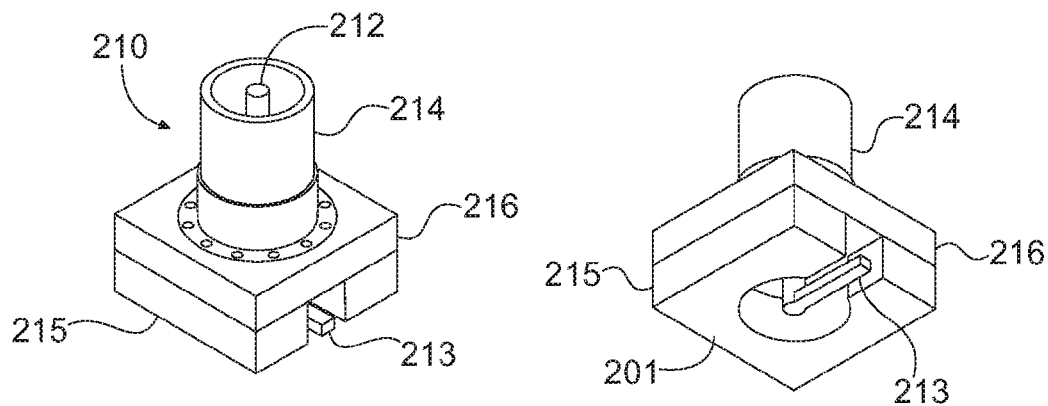
FIGS. 5A-5C schematically illustrate various exemplary connectors in accordance with the present invention, including a male surface-mount connector, male and female blindmate interconnects, and male connector with flex center pin, respectively.
Figure 5B:
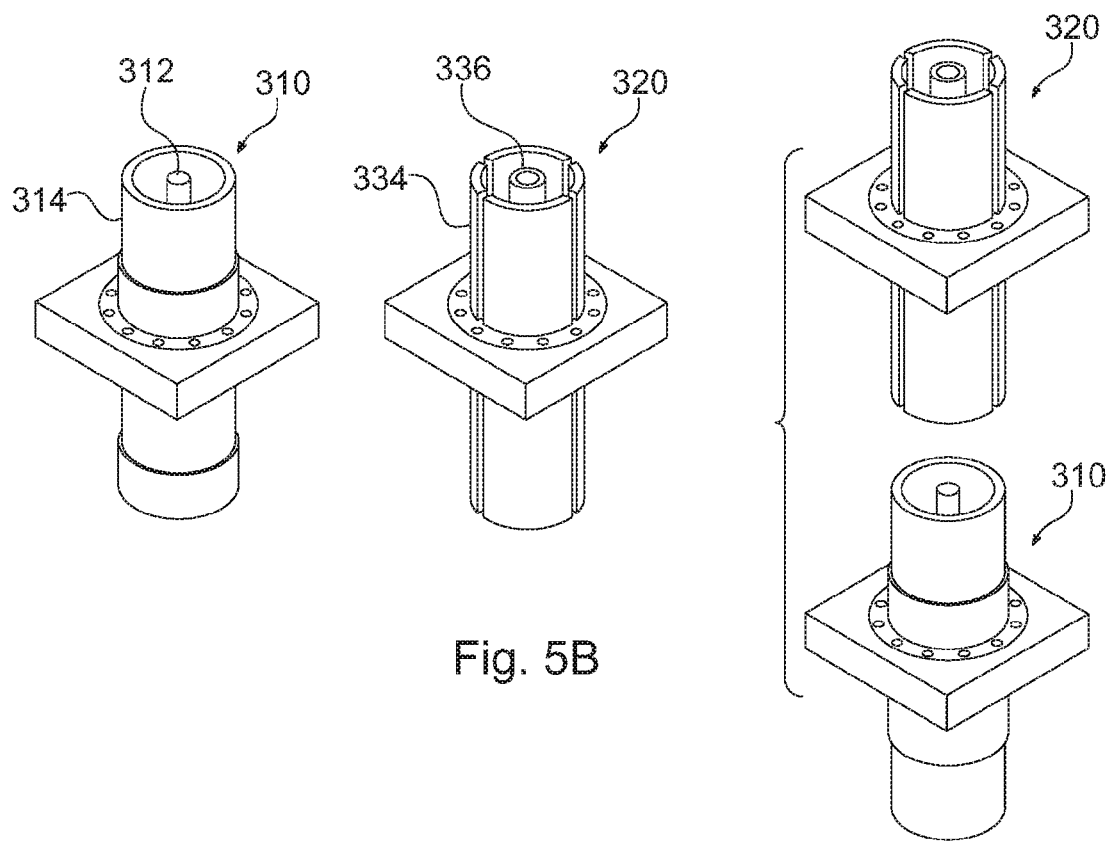

Alternatively or additionally, the array 200 may include one or more male and female blindmate interconnects 310, 320, respectively, each including a respective center conductor 312, 336 and outer conductor 314, 334 to provide a coaxial structure, FIG. 5B. The conductive walls of any of the exemplary connectors 210, 310, 320 may include split-tube constructions, e.g., as female blindmate interconnect 320, to act as flexures or may include threads to provide a screw-on connector. Whereas the exemplary connectors 210, 310, 320 are illustrated as having a coaxial configuration, other connector types such as non-circular coax (e.g. recta-coax) or multi-pin coax may be used, as well as other connector types such as USB or hollow waveguide connections. An advantage of the exemplary coaxial configuration of the connector 210 of FIG. 2A may be seen in terms of its voltage standing wave ratio (VSWR), which, according to a high-frequency structure simulator (HFSS) model, may be less than approximately 1.3:1 to 110 GHz, FIG. 2B. In addition, the connector 210 may have an insertion loss of less than approximately 0.1 dB and a return loss of greater than approximately 20 dB across the 1-110 GHz band for a ceramic substrate based design, FIG. 2C. FIG. 5B schematically illustrates how a male connector 310 can interface with a female connector 320 with the two vertically mating as shown on the right. While FIG. 5B shows a female bullet adapter 320 mounting to a male connector structure 310, it should be clear that connector 310 might more readily be a transition to a surface mount structure such as that shown in the connector 210 FIG. 5A. Alternatively, the right panel of FIG. 5B may schematically represent a transition to a small coaxial cable.

Figure 5C:
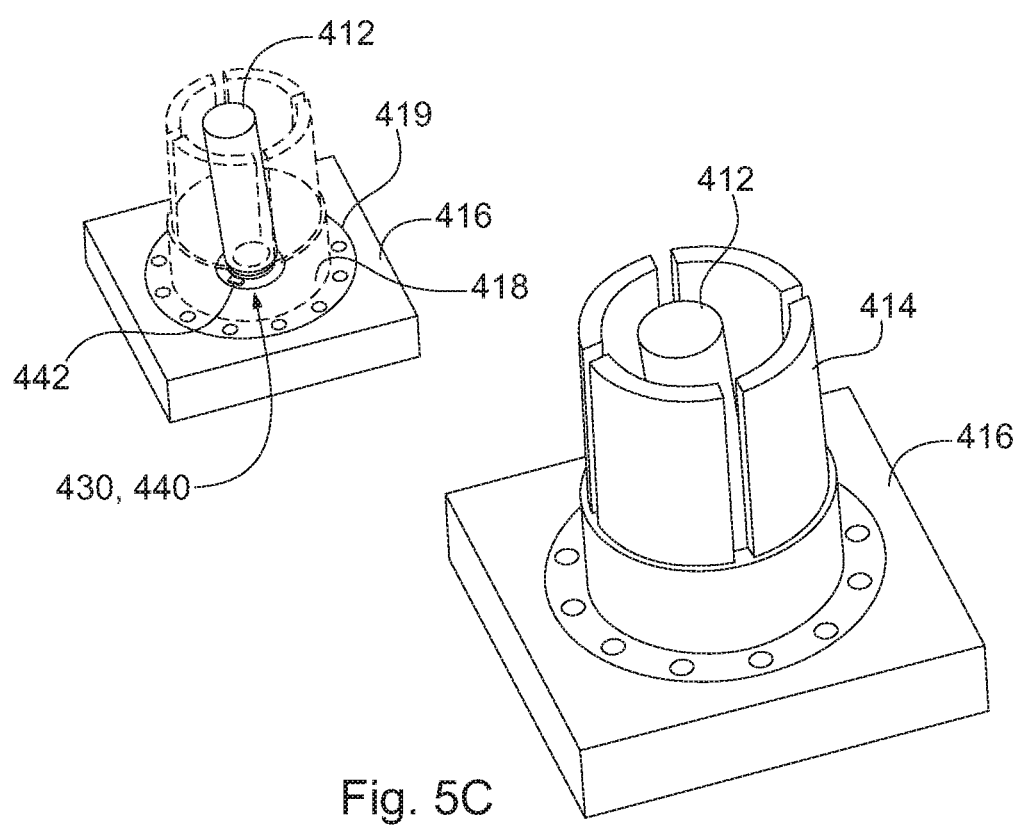

As a further optional configuration, the center conductor 412 may be mounted to a tilt element 430, such as flexure, spring or gimbal, for example, to permit tilting of the center conductor 412 relative to the substrate 416 within the outer conductor 414 to compensate for misalignment, FIG. 5C. For example, the tilt element 430, may include a gimbal 440 having opposing anchors 442 to anchor the gimbal 440 to a metal 418 disposed within a via 419 of the substrate 416, to provide a gimbal 440 in electrical connection with both the center conductor 412 and metal 418. The gimbal 440 may be 50 μm tall, be formed of a metal having a 10:1 aspect ratio, and have a 20 μm undercut to provide clearance to allow the center conductor 412 to tilt. The gimbal 440, or other flexures such as a spring, may be formed using a multilayer sequential build technique such as disclosed in the incorporated PolyStrata art (using sacrificial molds, planarization, and electroplating for example). Alternatively or additionally, flexures may be provided along the length of the center conductor 412 by modulating the diameter of the center conductor 412 in a determined manner.

Figure 3A:
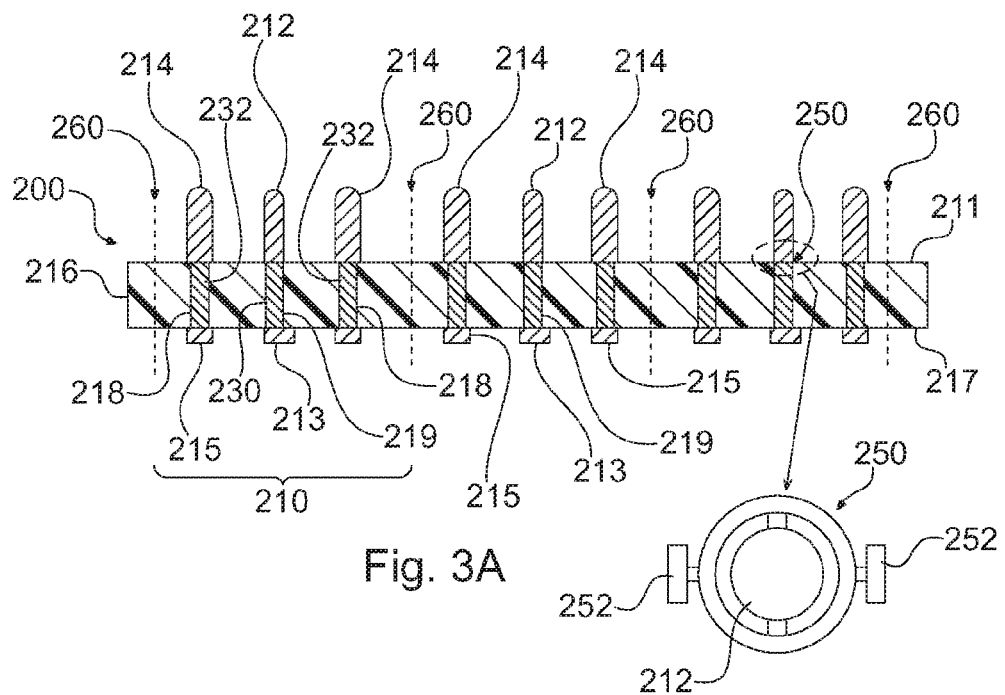
FIGS. 3A and 3B schematically illustrate exemplary configurations of 1 mm diameter connectors grown on a single substrate in accordance with the present invention, with FIG. 3A illustrating a cross-sectional view of a SMT array and FIG. 3B illustrating floating "bullets" (female-to-female adaptors), each of which may provide approximately 50,000 connectors on a single substrate, for example.
Figure 3B:
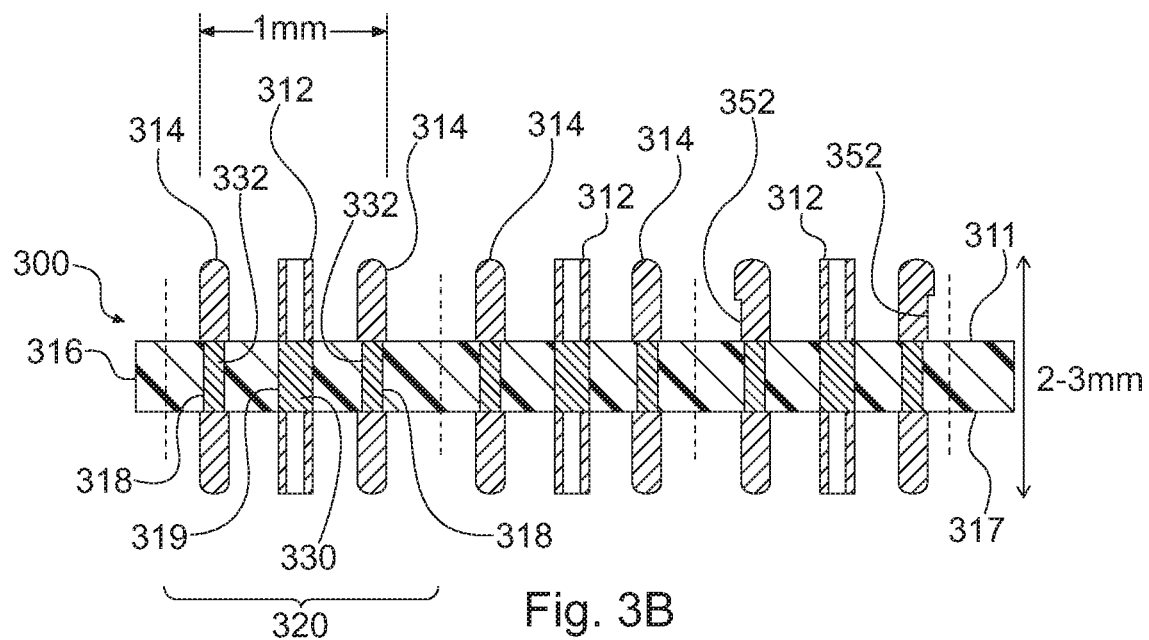

Turning to FIGS. 3A, 3B, further understanding of the structures and methods relating to connector arrays in accordance with the present invention may be had, in which detailed views of the substrate 216, 316 with thru- and surface metallization are shown. For example, FIG. 3A schematically illustrates a side cross-sectional view of a portion of the connector array 200 of FIG. 2A in which the substrate 216 is provided with a plurality of center conductor vias 219 and outer conductor vias 218 therethrough, each of which may be filled with either a respective metal plug 230, 232, e.g., copper, or surface metallization to permit the connectors 210 to electrically communicate across the substrate 216. The substrate 216 may comprise a 99.6% alumina ceramic wafer. A ceramic may be used to maximize processing temperature and also to provide a degree of thermal conductivity between the center conductor(s) and the outer conductor or conductors. Alternatively or additionally, the substrate 216 may comprise shaped or patterned or photopatterned dielectrics, such as benzocyclobutene (BCB), polyimide, Teflon® PTFE, SU-8 photoresist, parylene, or other dielectrics chosen for their dielectric loss, dielectric constant, thermo-mechanical properties, or ability to pattern or shape based on the requirements of the connector 210. Moreover, independent of the material chosen, the substrate 216 may be designed such that the connectors 210 may be separated at singulation points 260 to provide a plurality of discrete connectors 210 rather than an array 200.

The vias 218, 219 may conveniently have a generally cylindrical or other suitable shape. At an upper surface 211 of the substrate 216 generally cylindrical metal center conductors 212 may be disposed in electrical communication with respective center conductor metal plugs 230. Likewise, outer conductors 214 may be disposed at the upper surface 211 of the substrate in electrical communication with respective outer conductor metal plugs 232. The center and outer conductors 212, 214 may have rounded tips to aid in alignment. When formed out of plane of the substrate, such rounding may be accomplished by chemical or electropolishing a cylindrical form, tumbling in a abrasive powder, forming the approximate shape in a stepped manner, or any other suitable means. At a lower surface 217 of the substrate 216, center conductor mounting feet 213 may be provided in electrical communication with respective center conductor metal plugs 230, and outer conductor mounting feet 215 may be provided in electrical connection with outer conductor metal plugs 232 so the mounting feet 213, 215 are in electrical communication with the center and outer conductors 212, 214, respectively. Thus parts that are symmetric or asymmetric on either side of the substrate may formed depending on whether one is creating a floating connector bullet, a connector end, a connector adapter designed to go from a traditional coaxial or microcoaxial cable, or from a circuit board waveguide such a coplanar waveguide or a microstrip to a connector. In addition, a high density DC connector could be formed by only fabricating center conductor pin 212 without the outer conductor 214, and both RF and DC connectors may be fabricated simultaneously. It is also possible to fabricate the center and outer conductors 212, 214 independently. An RF connector array of elements which share (completely or partially) a common outer conductor could also be fabricated using this approach.

The impedance through the substrate 216 may be maintained by either increasing the outer conductor diameter or decreasing the center conductor diameter or both. Other suitable techniques to match impedance may be used, including those known in the art of microwave structures. A two axis gimbal 250 can be constructed as a flexure, similar to that described above with respect to FIG. 5C, having two opposing anchors 252 to attach the gimbal 250 to the substrate 216. The gimbal 250 may be 50 µm tall, be formed of a metal having a 10:1 aspect ratio, and have a 20 µm undercut to provide clearance to allow the center conductor 212 to tilt. The flexure itself, such as gimbal 250, or the layer on which the flexure is created may be constructed of the same or a different metal, such as a metal chosen for its mechanical and spring like properties. It should be noted that commercially available connectors to 110 GHz are designed for fifty ohm impedance; the agility of the PolyStrata process permits customization of the impedance of connectors of the present invention.

While a gimbal or flexure can be constructed in a multilayer build process similar to PolyStrata to address angular stress or misalignment, and elastic deformation can be leveraged within the limits of the materials and designs for providing contact force between mating components, one can also leverage flexures and/or spring deflections both along the axis and/or perpendicular to the axis of the coaxial connector center and/or outer conductors to help ensure mechanical contact between connected components over temperature cycles, mechanical shock, and vibration. In the event that DC signals are not required over the bandwidth of operation, one can design the connectors to provide microwave continuity when the connector ends are in suitable proximity by capacitive coupling or radiative coupling between mating connector ends separated by an air-gap or dielectric layer. For example, the region containing the mounting feet 213, 215 of the connector 210 shown in FIG. 2A, which provides transition from a coaxial mode to a CPW mode with the center conductor foot 213 and ground plane (outer conductor foot 215), could be similarly leveraged for capacitive or radiative coupling. For instance, two of the CPW transition structures on the lower half, if aligned and facing each other with a air or dielectric gap in between could electrically communicate with each other in the case where center conductor foot 213 acts as a quarter wave stub for each mating half. An exemplary capacitively coupled connector is described in C. M Lin & R. W. Grow, A Broad-Band Microwave Coaxial Connector with Capacitive RF Coupling and Isolated DC Returns, IRE Transactions on Microwave Theory and Techniques, Issue 6, Vol. 4, 454 (1958). While the reference shows capacitive coupling in the middle of a double sided type N connector, one could divide the picture along its left/right center, perpendicular to the coax, to form two mating halves at the capacitive disk. It should be clear to someone skilled in the art that many electromagnetic designs can be realized with the ability to microstructure and batch fabricate using a multilayer build process similar to those presented in the approach outlined in the incorporated PolyStrata art.

In an alternative exemplary configuration, the connector array 300 may comprise a plurality of female blindmate interconnects 320 as shown in the side cross-sectional view of FIG. 3B. A substrate 316 may be provided with a plurality of center conductor vias 319 and outer conductor vias 318 therethrough, each of which may be interconnected, mated to, or filled with a respective metal plug 330, 332, e.g., copper, or surface metallization to permit the connectors 320 to electrically communicate across the substrate 316. Such design properties may be important if the connector is to be repeatedly used though a number of pairing cycles. The substrate 316 may comprise similar materials to the substrate 216 of FIG. 3A. The vias 318, 319 may conveniently have a generally cylindrical shape or other suitable shape. At the upper and lower surfaces 311, 317 of the substrate 316 generally cylindrical female metal center conductors 312 may be disposed in electrical communication with respective center conductor metal plugs 330. Likewise, outer conductors 314 may be disposed in electrical communication with respective outer conductor metal plugs 332 at the upper and lower surfaces 311, 317. When produced out of the plane of the substrate 316, the outer conductor 314 of the female mating portion may be partitioned into a number of segments to allow improved deflection while limiting deformation of the metal itself. In addition, detents 352 may be provided on one side of the outer conductors 314, such as an exterior surface, to mate with detents in a part to which the connector 320 is to be attached. The use of a smooth-walled male on one side and detent on the other side may keep substantially all outer conductors 214 attached to the detent side. Such detents could also be used on inner conductors 312, or even separate mechanical structures included to help maintain alignment and/or connector retention when mated with the corresponding connector counterpart or counterparts.

The figures, such as FIGS. 2A, 5A, 5B, for example, illustrate coaxial connectors 210, 310, 320 which are desirable for the greatest bandwidth possible, for example spanning from DC to over 200 GHz. Connector structures, such as connectors 210, 310, however, could also provide interconnect for a hollow waveguide, particularly at mm and sub-mm wave frequencies, and may be circular, square, or rectangular in cross-section. In the case of hollow waveguide, a similar structure to the waveguides could be used, however no center conductor would need to be present. In such cases a solid substrate is not required, as there is no need to support the center pin. The structures could be all metallic or comprise a surface metalized dielectric. If a substrate layer is included, it would preferably be patterned to remove dielectric from the hollow waveguide passage, or would include a material that is highly transparent to microwaves, for example, made of quartz, silica, Teflon, low-K materials.

Such connector structures, coaxial or hollow waveguide, could be hermetic. In such cases, plugged via structures may be used to pass an electrical signal from inside to outside a substrate layer. In such cases, the substrate may contain a metalized region outside the perimeter of the coax or waveguide used to make a solder seal, although any alternative compatible means to attach the connector structure to a hermetic housing could be leveraged.

The connectors themselves, such as connectors 210, 310, 320, could incorporate a selectively deposited or applied thin solder layer at or near their mating surfaces. This would allow a modular build of a complex system and testing of it. Once the system tests well, a selective or non-selective application of heat would cause the make-break interconnect to become a permanent junction requiring yet another reflow of the solder at the mating surfaces to remove the parts. A conductive epoxy could serve a similar function, and for example, could be used in a partially cured "B-stage" during assembly and test, and only reflowed to permanently join the mating surfaces when desired. This could improve reliability during temperature cycles, shock, and vibration for the assembled system.

Turning now to FIGS. 6A-6D an exemplary process in accordance with the present invention is illustrated. Beginning at step 700, a dielectric substrate 716 may be provided having vias 718 which may be formed by laser drilling, DRIE (deep reactive ion etching), water jet, photopatterning, or other suitable process selected with regard to the chosen substrate material, FIG. 6A. The vias 718 may be made of a size and periodicity to electromagnetically contain the guided waves at the uppermost frequency of interest and can be designed in software like HFSS™ by Ansoft. Any alternative shape to the via fence approach may be used if it suitably contains the electromagnetic wave and is able to retain the substrate portions required. For example, a shape like a "C" may be cut or patterned in the dielectric for the outer conductor feedthrough, the center conductor being located on a via inside the "C" shape and the outer conductor portions either on, inscribing, or circumscribing the "C" shape. The vias 718 may be surface metalized and/or solid plugged with a conductor material 702 by one or more of vapor deposition, plating, or conductive epoxy, for example. The metal plugged or surface metalized via substrate 716 may have multilayer photomolds applied, followed by metal electroforming and/or planarization, step 730, FIG. 6B. Specifically, a mold 732 may be provided on a selective surface of the substrate 716 having passageways 734 disposed therethrough each respectively in communication with a metalized via 718 of the substrate 716. The passageways 734 may be cylindrical or annular in shape, and in the latter case may communicate with two vias 718. As part of Step 730, the passageways 734 may be plugged to provide center pin conductors 736 and outer barrel conductors 738 disposed in respective cylindrical and annular passageways 734. By omitting the center conductor 736 and sizing the vias 718 to provide the required waveguide size, a circular or rectangular waveguide connector could also be fabricated using this approach.

Figure 4:
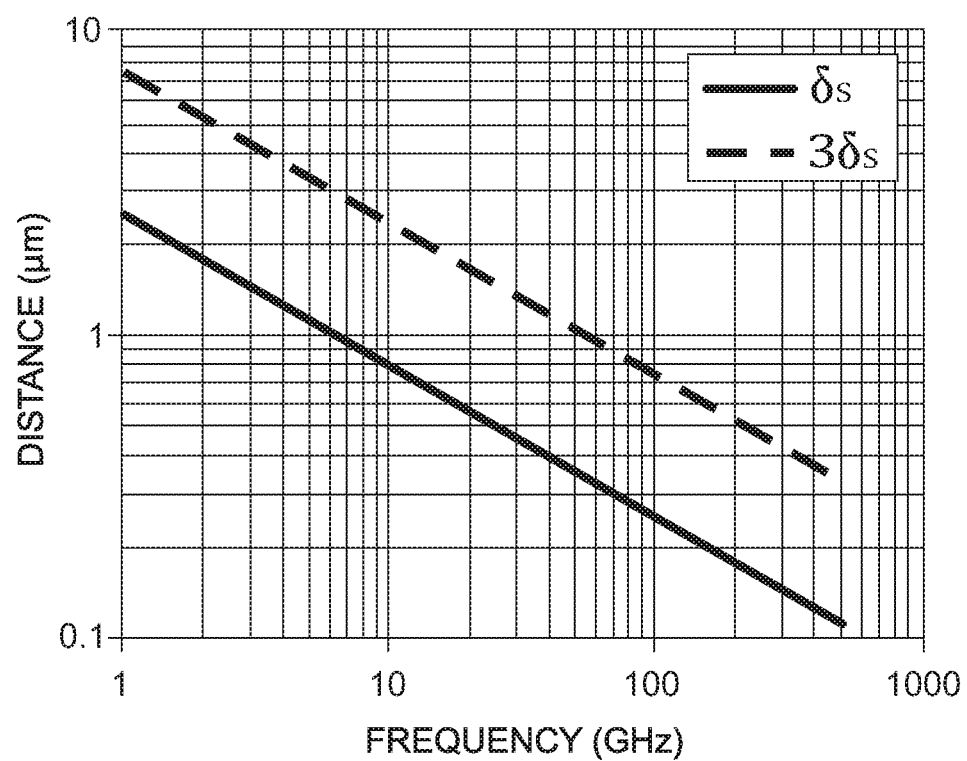
FIG. 4 illustrates one and three skin depths for gold versus frequency, demonstrating that the effect of underlying layers may be minimized at frequencies above 10 GHz with relatively little gold.

Step 730 may be repeated multiple times as added layer upon layers (per the PolyStrata or similar multilayer additive build techniques) for increased aspect ratio, such as up to 10:1, for example. Step 730 may also be repeated to add complexity, such as providing detents, flares, or up or down tapering, as well as to allow the metal conductors 736, 738 to act as flexures. Mechanical analysis may provide a basis for selecting the base construction material of the conductors 736, 738 from one or more of Cu, Ni, Be:Cu, and/or NiCo, and the like, for example, based on a deformation and/or contact force mechanical analysis. For instance, 3× standard hardness nickel (for example doped, alloyed, or microstructured) may be selected for use in high aspect ratio springs. While nickel core materials which may be used for building these structures may exhibit loss due to lower electrical conductivity and magnetic properties, above 10 GHz, substantially all of the RF energy may propagate in a conformal gold, silver, or other highly conductive surface coating. In particular, an analysis of the skin depth requirements may allow electroless conformal coatings of Cu/Pd/Au, Ni/Au, Ni/Ag/Au or other coatings as typically used in the microwave connector industry to provide low-loss coatings to 2-3 skin depths even at the low end of the band, FIG. 4.

Figure 6A:
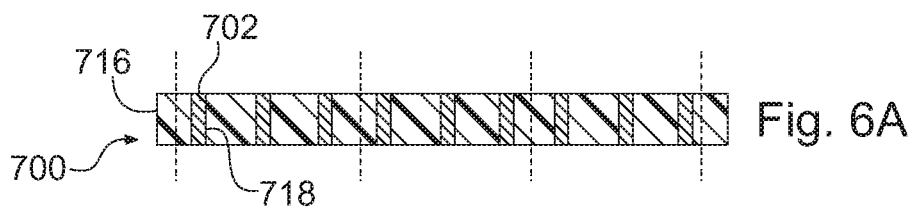
FIG. 6A-6D schematically illustrate an exemplary process flow for batch fabricating connectors in accordance with the present invention.
Figure 6B:
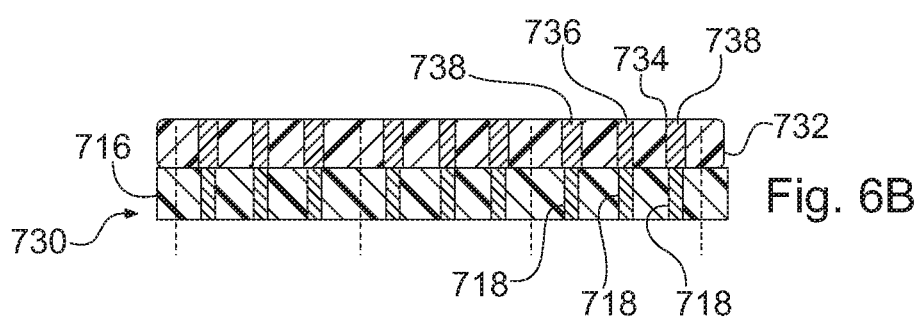
Figure 6C:
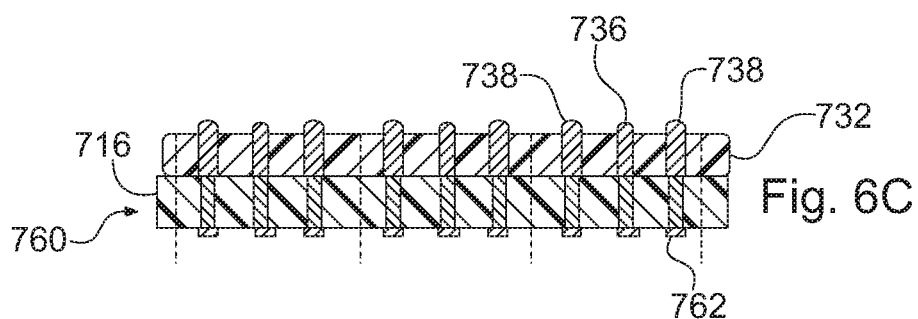
Figure 6D:
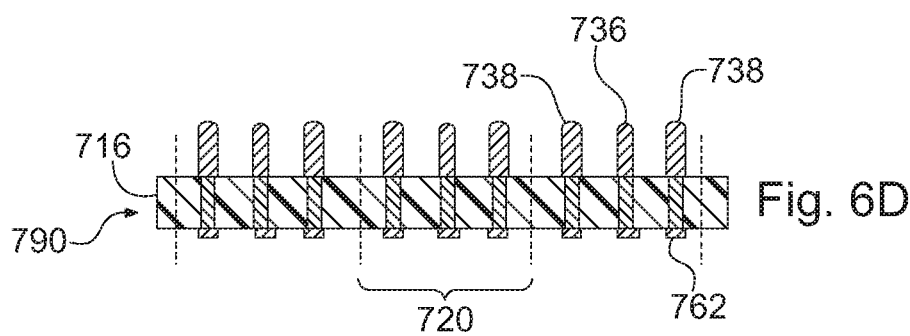

To achieve a smooth or rounded or radiused end surfaces for the connectors, turning to FIG. 6C, at Step 760 the upper layer or portion of the temporary mold 732 may be removed by etching such as by chemical or plasma ashing to reveal part of the metal conductors 736, 738. Removal of the upper mold portion can be followed by chemical polishing or electropolishing to round the exposed edges of the metal conductors 736, 738 to allow easier alignment and mating with the metal conductors 736, 738. The remaining mold material may be removed subsequently, Step 790, FIG. 6D, and process can be repeated to create connector or mounting structures 762 or other structures as desired on the opposing back side of the substrate 716. If double sided processing is used, typically the mold material will not be removed from either side of the substrate 716 until the end of the build process. However such smoothing or rounding steps can be performed on either or both sides in the same or similar manned as desired. Individual parts may then be singulated using dicing or other separation techniques depending on the dielectric substrate 716 used to provide single connectors 720. Alternatively, 1D or 2D connector arrays can be made.

Figure 7A:
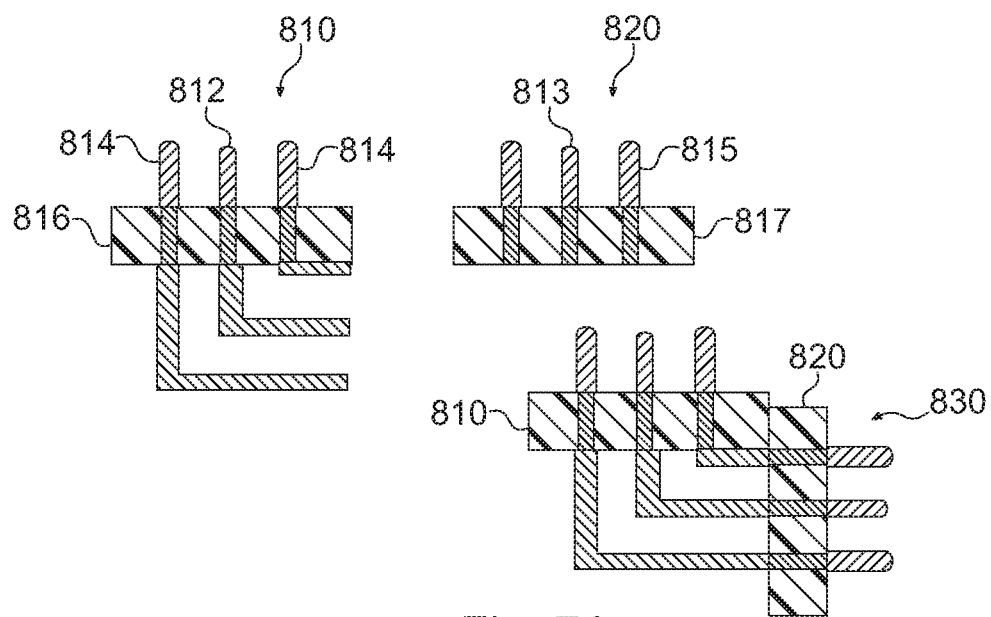
FIGS. 7A and 7B schematically illustrate exemplary coaxial right angle connectors of the present invention, mounted and un-mounted, respectively.
Figure 7B:
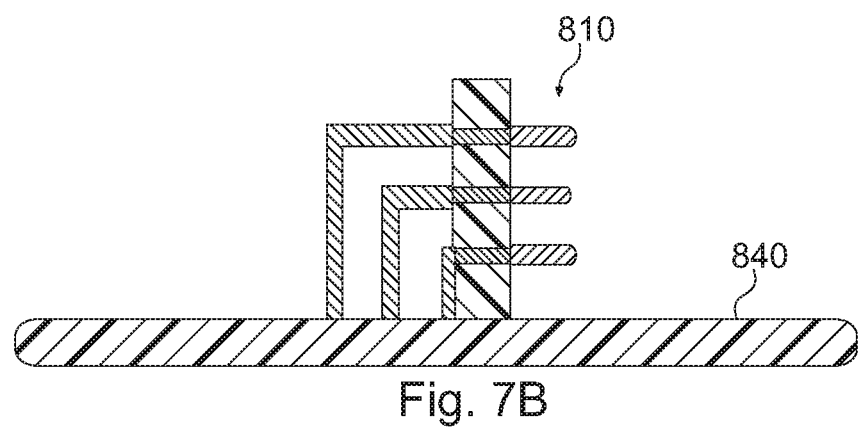

In yet a further aspect of the present invention, coaxial right angle connectors 810 may be provided, FIGS. 7A, 7B. Such connector structures can be used to make adapters to other connectors, to make right angle connections, and connection to circuit boards, coaxial cables, etc. A first, right angle connector 810 may be provided as a portion of a right angle coaxial structure comprising a center conductor 812 and outer conductor 814 which may be supported by a nonconducting substrate or support member 816. A second connector 820 may comprise a center conductor 813 and outer conductor 815 supported by a support member 817 and structured such that the center conductor 813 and outer conductor 815 may electrically communicate with the corresponding center conductor 812 and outer conductor 814 of the first right angle connector 810, FIG. 7A. The center and outer conductors 812, 814, 813, 815 of the first and second connectors 810, 820 may be joined in electrical communication using a solder or conductive epoxy, for example, to form a unitary connector or adapter 830. The pitch between center and outer conductors 812, 814 of the right angle connector 810 may differ before and after the right angle bend to facilitate the use of the right angle connector 810 in a dilation layer. In addition, the first and second connectors 810, 820 may be provided in a one-dimensional or two-dimensional array which may be interconnected to provide a one-dimensional or two-dimensional array of conjoined connectors 830. Alternatively, the right angle connector 810 may be mounted directly to a substrate 840, such as a circuit board, chip or MMIC, for example, as a surface normal interconnect to provide a ground-signal-ground or other transition to adapt to a microstrip or coplanar waveguide on the substrate 840, FIG. 7B. Such connectors 810, 820 may also be combined with monolithic dilations for EW, sensor, and small radar sized phased array apertures (e.g., approximately 12" and below).

Additional functionality may be incorporated into the structures by incorporating active or passive electronics into the connector structures themselves. For example, in FIG. 5A on the backside or the front side of the substrate layer 216 one can apply such active or passive electronics. For example if the substrate layer 216 comprises a ceramic or silicon layer, a thin-film, thick-film, or small surface mount resistor or resistors may be provided on the substrate layer 216 to bridge the center and outer conductor 212, 214, for example to create a 50-ohm termination often desired in phased array antenna radiators. One could also replace the substrate layer 216 with a layer containing active devices or insert active devices into regions on the back side or front side of the connector 210. For example if the substrate layer 216 was made of silicon, a layer of Si—Ge or other devices, possibly including their affiliated actives, passives, their interconnect could be incorporated. Other active devices such as GaAs, GaN, InP, etc. could be incorporated directly or hybridly (for example with solder or conductive epoxy) into the connector structure or the connectors could be formed directly on their wafers. While such active devices and their substrates at microwave frequencies may be too thin or fragile for a make-break interconnect on their surface alone, they may be mounted or connected to a handle substrate to improve their mechanical strength. One could thus provide signal detectors, bias monitors, tuning functions such as resistance or capacitance, or other functions directly in the connector structures. As the functions can be built into or onto a substrate on which the connectors may be grown, or added after they are formed, such functions can be provided regardless of if they are added during or after the batch manufacturing and then released and separated into individual devices. Further forming such connectors directly on the front side or back side of active device wafers could provide a method to achieve a chip-scale interconnect allowing very high end microwave circuits to be both tested and replaced in a circuit without the need for soldering or compromising performance in using wirebonds at mm-wave frequencies.

The substrate 216 in FIG. 5A can be the substrate on which such connector structures are formed, or it may be part of a non-conductive layer that is added in the multilayer build, for example it may be formed of a photo patterned dielectric.

Lateral interconnects may be formed along the edge of a device or circuit substrate and may or may not include a perpendicular transition in the connector. For example, such coaxial connectors may be placed or attached along the edge of a microwave hybrid circuit allowing such circuits to be built as separate modules and then interconnected to form more complex devices and/or assemblies. The connectors may be formed or co-fabricated as part of the microwave circuit or could be attached in a 1D or 2D array along one or more edges. Thus a number of microwave circuit board or circuits on ceramic or formed in PolyStrata can be interconnected or joined in a plane. When not formed as part of the circuit, lateral connectors may be formed individually or as 1D arrays including stacked arrays in or on part of a substrate in a batch manufacturing mode, where the format or shape may be that of FIG. 7B and the batch manufacturing is similar to that of FIG. 2A.

While the lateral interconnects may be used to allow modular plug-n-play builds, a surface mount transitioning to surface normal microconnector may be constructed using a different architecture. The interconnects may use relatively high aspect ratio multilayer metal and/or high strength heavy gold coated Ni or NiCo cores for spring layers using plating processes that form relatively small grains. Exemplary configurations may have an approximately 10:1 aspect ratio in triple hardness nickel springs, for instance. Such aspect ratio may be obtained in one or multiple layers.

Using a batch manufacturing wafer or substrate scale approach to three-dimensional manufacturing such connectors, approximately 10,000 connectors may be made monolithically using multilayer, double sided UV-LIGA (lithography, electroplating and molding using ultraviolet light) on each 6" laser drilled and filled via ceramic substrates. This presumes the connectors will consume approximately 1 to 1.25 mm on a side as may be the case for a mm-wave capable miniature connector. Both split-tube and/or pin/split-tube in tube constructions may be made for coaxial interconnect as well as compression spring designs.

The exemplary devices and methods described may be understood to provide a variety of benefits such as improved power handling (e.g., exceeding the power handling of push-on floating connectors while accounting for scaling laws), with increased power handling provided by larger diameter structures. Additionally, during operation and deployment connectors of the present invention may be removed for system repair and service in the field, and leveraging them in a system design such as a phased array may allow module replacement and repair of the electronic system. Moreover, whereas relatively small components, such as a conventional 1 mm barrel may be challenging to handle without specialized tools or fixtures, pre-alignment pins may be provided to guide parts together allowing hand placement and/or tool (e.g., screwdriver) leveraged removal. For example, an in-plane lateral connector may be provided in any of the above device configurations which may be used to snap together components including MMICs and/or modules into higher level assemblies at the board level. Such an interconnect can be formed with the device and/or mounted to existing devices. In addition, a maximized and/or improved aspect ratio as compared to related mechanical turning operations is realized in the present invention. Still further devices and methods of the present invention may provide increased mechanical strength between the fused layers, and since mechanical strain may be placed on metals, near bulk strength adhesion between said layers may be desirable.

These and other advantages of the present invention will be apparent to those skilled in the art from the foregoing specification. For instance, the devices and methods of the present invention have been exemplified as providing parts which include a dielectric substrate which is incorporated in the final part. Alternatively, the substrate may provide a mounting surface for the PolyStrata build processes in which a dielectric layer(s) are deposited in selected strata above the substrate, and the part so formed and containing the dielectric layer(s) may be subsequently removed from the substrate. Accordingly, it will be recognized by those skilled in the art that changes or modifications may be made to the above-described embodiments without departing from the broad inventive concepts of the invention. It should therefore be understood that this invention is not limited to the particular embodiments described herein, but is intended to include all changes and modifications that are within the scope and spirit of the invention as set forth in the claims.

What is claimed is:

1. A multilayer microconnector structure formed by a multilayer additive build process, comprising:
   a base layer having first and second opposing surfaces and having a plurality of vias extending therebetween;
   a conductive material disposed within the vias and configured to provide electrical communication between the first and second surfaces;
   a first layer of conductor material disposed over the base layer at the first surface, the conductive layer comprising a plurality of electrically isolated upper conductive connector portions, each upper connector portion disposed in electrical communication with the conductive material of a respective via; and
   a second layer of conductor material disposed over the base layer at the second surface, the second conductive layer comprising a plurality of electrically isolated conductive lower connector portions, each lower connector portion disposed in electrical communication with the conductive material of a respective via, wherein the upper and lower conductor portions are structured to provide a microconnector.

2. The multilayer microconnector structure according to claim 1, wherein the base layer comprises a ceramic wafer.

3. The multilayer microconnector structure according to claim 1, wherein the base layer comprises a dielectric.

4. The multilayer microconnector structure according to claim 1, wherein the base layer comprises a patterned dielectric.

5. The multilayer microconnector structure according to claim 1, comprising a substrate, wherein the first layer of conductor material, base layer, and second layer of conductor material are disposed over the substrate.

6. The multilayer microconnector structure according to claim 1, wherein the upper conductive connector portions comprise a center conductor and an outer conductor disposed about the center conductor.

7. The multilayer microconnector structure according to claim 6, wherein the center and outer conductors form a coaxial connector.

8. The multilayer microconnector structure according to claim 6, wherein the center conductor comprises a male connector.

9. The multilayer microconnector structure according to claim 6, wherein the center conductor comprises a female connector.

10. The multilayer microconnector structure according to claim 6, wherein the lower conductive connector portions comprise a center conductor and an outer conductor disposed about the center conductor.

11. The multilayer microconnector structure according to claim 1, wherein at least one of the upper conductive connector portions comprises a blindmate interconnect.

12. The multilayer microconnector structure according to claim 11, wherein at least one of the lower conductive connector portions comprises a blindmate interconnect.

13. The multilayer microconnector structure according to claim 1, wherein at least one of the upper conductive connector portions comprises a flexure disposed along a length of the at least one upper conductive connector portion.

14. The multilayer microconnector structure according to claim 13, wherein the flexure comprises a split-tube construction.

15. The multilayer microconnector structure according to claim 1, wherein at least one of the lower conductive connector portions comprises a mounting foot.

16. The multilayer microconnector structure according to claim 1, comprising a flexure disposed proximate a base portion of a selected one of the upper conductor portions to permit tilting of the selected one of the upper conductor portions.

17. The multilayer microconnector structure according to claim 16, wherein the flexure comprises a gimbal.

18. The multilayer microconnector structure according to claim 1, wherein the conductive material disposed within the vias comprises a metal plug that fills the vias.

19. The multilayer microconnector structure according to claim 1, wherein the conductive material disposed within the vias comprises a metallization of the surface of the vias.

20. The multilayer microconnector structure according to claim 1, wherein the upper conductive connector portions comprise a base material having a metal disposed over the base material.

21. The multilayer microconnector structure according to claim 20, wherein the base material comprises one or more of Cu, Ni, Be:Cu, and NiCo.

22. The multilayer microconnector structure according to claim 20, wherein the metal disposed over the base material comprises one or more of Cu/Pd/Au, Ni/Au, and Ni/Ag/Au.

23. The multilayer microconnector structure according to claim 1, wherein the upper and lower conductor portions are structured to provide an array of microconnectors.

24. A method for forming a multilayer microconnector structure, comprising:
depositing a plurality of layers, wherein the layers comprise one or more of a metal material, a sacrificial mold material, and a dielectric material, thereby forming a multilayer microconnector structure comprising:
a base layer having first and second opposing surfaces and having a plurality of vias extending therebetween;
a conductive material disposed within the vias and configured to provide electrical communication between the first and second surfaces;
a first layer of conductor material disposed over the base layer at the first surface, the conductive layer comprising a plurality of electrically isolated upper conductive connector portions, each upper connector portion disposed in electrical communication with the conductive material of a respective via; and
a second layer of conductor material disposed over the base layer at the second surface, the second conductive layer comprising a plurality of electrically isolated conductive lower connector portions, each lower connector portion disposed in electrical communication with the conductive material of a respective via, wherein the upper and lower conductor portions are structured to provide a microconnector.

25. The method according to claim 24, wherein the base layer comprises a ceramic wafer.

26. The method according to claim 24, wherein the base layer comprises a dielectric.

27. The method according to claim 24, wherein the base layer comprises a patterned dielectric.

28. The method according to claim 24, comprising a providing a substrate and depositing the first layer of conductor material, base layer, and the second layer of conductor material are disposed over the substrate.

29. The method according to claim 28, comprising removing the first layer of conductor material, base layer, and the second layer of conductor material from the substrate to provide a freestanding multilayer microconnector structure.

30. The method according to claim 24, wherein the upper conductive connector portions comprise a center conductor and an outer conductor disposed about the center conductor.

31. The method according to claim 30, wherein the center and outer conductors form a coaxial connector.

32. The method according to claim 30, wherein the center conductor comprises a male connector.

33. The method according to claim 30, wherein the center conductor comprises a female connector.

34. The method according to claim 30, wherein the lower conductive connector portions comprise a center conductor and an outer conductor disposed about the center conductor.

35. The method according to claim 24, wherein at least one of the upper conductive connector portions comprises a blindmate interconnect.

36. The method according to claim 35, wherein at least one of the lower conductive connector portions comprises a blindmate interconnect.

37. The method according to claim 24, wherein at least one of the upper conductive connector portions comprises a flexure disposed along a length of the at least one upper conductive connector portion.

38. The method according to claim 37, wherein the flexure comprises a split-tube construction.

39. The method according to claim 24, wherein at least one of the lower conductive connector portions comprises a mounting foot.

40. The method according to claim 24, comprising a flexure disposed proximate a base portion of a selected one of the upper conductor portions to permit tilting of the selected one of the upper conductor portions.

41. The method according to claim 40, wherein the flexure comprises a gimbal.

42. The method according to claim 24, wherein the conductive material disposed within the vias comprises a metal plug that fills the vias.

43. The method according to claim 24, wherein the conductive material disposed within the vias comprises a metallization of the surface of the vias.

44. The method according to claim 24, wherein the upper conductive connector portions comprise a base material having a metal disposed over the base material.

45. The method according to claim 44, wherein the base material comprises one or more of Cu, Ni, Be:Cu, and NiCo.

46. The method according to claim 44, wherein the metal disposed over the base material comprises one or more of Cu/Pd/Au, Ni/Au, and Ni/Ag/Au.

47. The method according to claim 24, wherein the upper and lower conductor portions are structured to provide an array of microconnectors.

48. A dilation for providing transition between a first array of a first pitch at a first surface of the dilation to a second array of a second pitch at a second surface thereof, the first pitch being greater than the second pitch, the dilation comprising coaxial transmission lines extending within the dilation, each line extending from a respective element of the first array to a respective element of the second array.

49. The dilation array according to claim 48, wherein the coaxial transmission lines comprise 3D-RF routing.

50. The dilation array according to claim 48, wherein the dilation comprises a monolithic part.

51. The dilation array according to claim 48, comprising a plurality of connectors at the first and second surfaces, each connector associated with a respective array element.

52. A method of forming a dilation by a sequential build process, comprising:

providing a plurality of layers, wherein the layers comprise one or more layers of a conductive material and one or more layers of a sacrificial material, the plurality of layers collectively providing a dilation for providing transition between a first array of a first pitch at a first surface of the dilation to a second array of a second pitch at a second surface thereof, the first pitch being greater than the second pitch, the dilation comprising coaxial transmission lines extending within the dilation, each line extending from a respective element of the first array to a respective element of the second array.

53. The method of claim 52, wherein the coaxial transmission lines comprise 3D-RF routing.

54. The multilayer microconnector structure according to claim 1, wherein each upper connector portion is electrically connected by a respective via to a respective lower connector portion to provide a plurality of discrete, electrically isolated microconnectors.

55. The method of claim 24, wherein each upper connector portion is electrically connected by a respective via to a respective lower connector portion to provide a plurality of discrete, electrically isolated microconnectors.

* * * * *